(12) United States Patent
McCloy

(10) Patent No.: US 9,503,331 B2
(45) Date of Patent: Nov. 22, 2016

(54) BLADE ENCLOSURE

(71) Applicant: International Business Machines Corporation, Armonk, NY (US)

(72) Inventor: Ian James McCloy, Manchester (GB)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 13/899,021

(22) Filed: May 21, 2013

(65) Prior Publication Data

US 2013/0318225 A1    Nov. 28, 2013

(30) Foreign Application Priority Data

May 24, 2012   (GB) .................................. 1209089.0

(51) Int. Cl.
| G06F 15/173 | (2006.01) |
| H04L 12/24 | (2006.01) |
| G06F 15/16 | (2006.01) |
| H05K 7/14 | (2006.01) |

(52) U.S. Cl.
CPC ............. H04L 41/24 (2013.01); G06F 15/161 (2013.01); H05K 7/1487 (2013.01)

(58) Field of Classification Search
CPC .... H04L 41/24; G06F 15/161; H05K 7/1487
USPC .................. 709/219, 223, 224, 225; 370/217
See application file for complete search history.

(56) References Cited

U.S. PATENT DOCUMENTS

| 5,251,150 | A | * | 10/1993 | Ladner | ................... | G01R 19/25 |
| | | | | | | 702/127 |
| 5,913,034 | A | * | 6/1999 | Malcolm | ....................... | 709/223 |
| 5,938,772 | A | * | 8/1999 | Welch | ..................... | G06F 1/181 |
| | | | | | | 713/320 |
| 6,034,868 | A | * | 3/2000 | Paul | ........................ | G06F 1/184 |
| | | | | | | 361/679.02 |
| 6,058,022 | A | * | 5/2000 | Gianni | ................. | H05K 1/0227 |
| | | | | | | 257/728 |
| 6,621,692 | B1 | | 9/2003 | Johnson et al. | | |
| 7,120,874 | B2 | * | 10/2006 | Shah | ........................ | G06F 8/34 |
| | | | | | | 709/223 |
| 7,187,265 | B1 | | 3/2007 | Senogles et al. | | |
| 7,386,610 | B1 | * | 6/2008 | Vekiarides | .......... | G06F 11/2071 |
| | | | | | | 709/213 |
| 7,666,004 | B2 | * | 2/2010 | Johnson | ............... | H05K 7/1467 |
| | | | | | | 439/76.1 |
| 7,814,255 | B1 | * | 10/2010 | Deva | .................... | G06F 13/4081 |
| | | | | | | 710/10 |
| 8,095,689 | B2 | * | 1/2012 | Abu-Akel | ............... | H04L 12/12 |
| | | | | | | 709/223 |
| 8,621,062 | B1 | * | 12/2013 | Anderson | ............... | G06F 11/30 |
| | | | | | | 709/223 |
| 9,319,313 | B2 | * | 4/2016 | Swaminathan | ......... | H04L 69/22 |
| 2003/0011579 | A1 | * | 1/2003 | Gong | .................... | H03K 17/962 |
| | | | | | | 345/204 |
| 2003/0046452 | A1 | * | 3/2003 | Andrewartha | .......... | G06F 1/181 |
| | | | | | | 710/2 |
| 2003/0093698 | A1 | * | 5/2003 | Challener | ............. | G06F 21/606 |
| | | | | | | 726/22 |
| 2004/0003082 | A1 | * | 1/2004 | Abbondanzio | ......... | H04L 67/34 |
| | | | | | | 709/225 |
| 2004/0148385 | A1 | * | 7/2004 | Srinivasan et al. | ........... | 709/224 |
| 2005/0010709 | A1 | * | 1/2005 | Davies | ................ | G06F 11/1456 |
| | | | | | | 710/305 |

(Continued)

OTHER PUBLICATIONS

Anonymous, "Integration of I/O Rack Devices to Docking Station", IP.com Technical Disclosure No. IPCOM000213217D, Dec. 9, 2011.

*Primary Examiner* — Thu Ha Nguyen
(74) *Attorney, Agent, or Firm* — Roy W. Truelson; James R. Nock

(57) ABSTRACT

A blade enclosure comprises a plurality of physical interfaces of a first type, each for connecting a blade to the blade enclosure, a plurality of physical interfaces of a second type, each for connecting a conventional computer to the blade enclosure, a management component connected to the physical interfaces and for managing the blades and conventional computers connected to the physical interfaces, and a body containing the physical interfaces and the management component.

12 Claims, 4 Drawing Sheets

(56) References Cited

U.S. PATENT DOCUMENTS

| | | | |
|---|---|---|---|
| 2005/0044186 A1* | 2/2005 | Petrisor | 709/219 |
| 2005/0052850 A1 | 3/2005 | Dickey et al. | |
| 2005/0129035 A1* | 6/2005 | Saito | 370/401 |
| 2005/0138439 A1* | 6/2005 | Rothman | G01S 5/14 713/300 |
| 2005/0175341 A1* | 8/2005 | Ovadia | H04L 29/06 398/43 |
| 2005/0286235 A1* | 12/2005 | Randall | H05K 7/1492 361/724 |
| 2006/0077724 A1* | 4/2006 | Chikusa | G06F 11/1076 365/189.05 |
| 2006/0125358 A1 | 6/2006 | Williamson | |
| 2006/0184785 A1* | 8/2006 | Challener | G06F 21/606 713/151 |
| 2007/0005925 A1* | 1/2007 | Burkley | G06F 12/023 711/170 |
| 2007/0083861 A1 | 4/2007 | Becker et al. | |
| 2007/0220318 A1 | 9/2007 | Kalos et al. | |
| 2007/0237071 A1* | 10/2007 | Chiasson | G06F 13/387 370/217 |
| 2007/0255857 A1* | 11/2007 | Loffink | G06F 13/4022 710/1 |
| 2008/0016200 A1 | 1/2008 | Fukumi | |
| 2008/0065763 A1* | 3/2008 | Lai | H04L 12/2602 709/224 |
| 2008/0065787 A1* | 3/2008 | Lai | G06F 3/023 710/5 |
| 2008/0313642 A1 | 12/2008 | Karaoguz et al. | |
| 2009/0037566 A1* | 2/2009 | Hoile | G06Q 30/02 709/223 |
| 2009/0177877 A1* | 7/2009 | Holdaway | G06F 9/44505 713/2 |
| 2009/0186494 A1* | 7/2009 | Bell, Jr. | H05K 7/1487 439/65 |
| 2009/0252329 A1* | 10/2009 | Casey et al. | 380/279 |
| 2011/0010566 A1* | 1/2011 | Bandholz | G06F 1/3203 713/300 |
| 2011/0090633 A1* | 4/2011 | Rabinovitz | G06F 1/184 361/679.31 |
| 2011/0113115 A1 | 5/2011 | Chang et al. | |
| 2011/0145332 A1* | 6/2011 | Paulson et al. | 709/204 |
| 2011/0238855 A1* | 9/2011 | Korsunsky et al. | 709/231 |
| 2012/0005392 A1* | 1/2012 | Yagi | G06F 13/409 710/313 |
| 2012/0054248 A1* | 3/2012 | Mehrotra | G06F 17/30557 707/803 |
| 2012/0134673 A1* | 5/2012 | Palanisamy et al. | 398/58 |
| 2012/0166957 A1* | 6/2012 | Cramer et al. | 715/736 |
| 2012/0269514 A1* | 10/2012 | Nedovic | H04B 10/801 398/66 |
| 2012/0291026 A1* | 11/2012 | Biswas | H04L 49/208 718/1 |
| 2013/0091589 A1* | 4/2013 | Shiakallis | G06F 21/86 726/34 |
| 2014/0075173 A1* | 3/2014 | Bower et al. | 713/2 |
| 2014/0281181 A1* | 9/2014 | Fromm | G06F 3/0653 711/104 |
| 2014/0298091 A1* | 10/2014 | Carlen | H04L 65/80 714/15 |
| 2015/0067308 A1* | 3/2015 | Dasari et al. | 713/1 |
| 2015/0067309 A1* | 3/2015 | Dasari et al. | 713/1 |
| 2015/0095515 A1* | 4/2015 | Krithivas | H04L 49/00 709/245 |
| 2015/0160702 A1* | 6/2015 | Franz | H05K 7/20772 361/679.47 |
| 2015/0207731 A1* | 7/2015 | Swaminathan | H04L 69/22 370/392 |
| 2015/0261677 A1* | 9/2015 | Malewicki | G06F 12/0831 711/146 |
| 2015/0293868 A1* | 10/2015 | Hishida | G06F 11/2028 710/38 |

\* cited by examiner

BLADE ENCLOSURE

FIELD OF THE INVENTION

This invention relates to a blade enclosure and to a method of operating a blade enclosure.

BACKGROUND

A blade enclosure is used to provide computing resources to one or more external devices. A typical blade enclosure will hold multiple blades. The individual blades within the enclosure provide computing and/or storage functionality and the blade enclosure provides services such as power, cooling, networking, various interconnects and management to the blades. Together, the blades and the blade enclosure form a blade system. The blade enclosure (or chassis) performs many of the non-core computing services found in most computers, such as handling network connectivity, for example. The blades can easily be added or removed from the blade enclosure to change or upgrade the function of the blade enclosure and the overall enclosure provides a flexible solution to the delivery of computing services.

BRIEF SUMMARY OF THE INVENTION

According to a first aspect of the present invention, there is provided a blade enclosure comprising a plurality of physical interfaces of a first type, each for connecting a blade to the blade enclosure, a plurality of physical interfaces of a second type, each for connecting a conventional computer to the blade enclosure, a management component connected to the physical interfaces and for managing the blades and conventional computers connected to the physical interfaces, and a body containing the physical interfaces and the management component.

According to a second aspect of the present invention, there is provided a method of operating a blade enclosure comprising a plurality of physical interfaces of a first type, each for connecting a blade to the blade enclosure, a plurality of physical interfaces of a second type, each for connecting a conventional computer to the blade enclosure, a management component connected to the physical interfaces and for managing the blades and conventional computers connected to the physical interfaces, and a body containing the physical interfaces and the management component, the method comprising the steps of detecting the connection of a conventional computer to a physical interface of a second type, and connecting to a processor of the connected conventional computer.

Owing to the invention, it is possible to provide a blade enclosure that is able to take advantage of the spare capacity available from unused computing resources. A conventional computer, in the context used here, is a portable computing device that is self-contained and provides processing, storage, power, user interface, and display functionality. Such a computing device could be a laptop computer, a tablet computer, a handheld (palm) computer or a mobile (smart) phone, for example. This computing device can operate on its own, without needing to be connected to any other device, and is conventionally used by individuals to provide computing and communication needs in a professional and/or personal environment.

It is common for IT departments to keep on-hand spare tablet computers and laptop computers to either replace broken equipment or to provide to new employees. The improved blade enclosure would be able to exploit the computing power of these spare machines until they are required. Tablets and more increasingly laptops are using solid state storage and no longer have moving parts, thus can be used without wearing them out. Such spare machines are roughly the same size as a conventional blade and have extensive computational potential. Instead of storing them switched off in a cupboard until they are needed, they could be placed into a blade enclosure and be utilized.

Preferably, the blade enclosure further comprises one or more caddies for receiving a conventional computer, each caddy being connected to a physical interface of the first type and comprising a physical interface of the second type. The blade enclosure can include one or more caddies that can each be used to mount a conventional computer that is connected into the blade enclosure. Each caddy provides a cradle that connects to the tablet or laptop being added to the blade enclosure and will also connect directly to an existing interface within the blade enclosure. This provides a way of connecting in the unused computing resources without having to make any modifications to the existing interfaces within the blade enclosure.

By using the I/O connector which already exists on most tablets and laptops, which is provided for a docking station, a blade enclosure would ideally communicate with the new device when it is plugged in disable any wireless interfaces and make its CPU and memory available, for example as part of a computer cluster. The cluster nodes would be managed from the blade centre management component. Firmware on the device would run in a cluster node mode when in the blade enclosure and as an independent standard device when removed from the blade enclosure. Ideally centralised SAN storage either in the blade enclosure or connected to the blade enclosure would provide the storage to each device that is plugged in. This way the data and storage on the device is never modified and there is no risk of cross-contamination. Additionally, employees could even place their tablet or laptop into the blade enclosure when they go home at night or over a weekend, collecting their computer only when they need it.

Preferably, the management component is arranged to detect connection of a conventional computer to a physical interface of a second type, to connect to a processor of the connected conventional computer, to boot the connected conventional computer following detection of the connection, to prevent connection to a storage device of the connected conventional computer and to disable the wireless functionality of the connected conventional computer. The management component of the blade enclosure can be arranged to handle the connection of the conventional computer to the blade enclosure. When a new device is connected to the blade enclosure, the management component can perform a series of steps to boot up the new computer, prevent access to the storage of the new computer and disable any and all wireless functions of the newly connected computer. This provides a regulated process that will ensure that the new conventional computer that has been added to the blade enclosure is available for use within the blade enclosure without any risk of contamination of the storage devices within the new conventional computer and without any risk that the wireless functionality of the computer can be abused.

BRIEF DESCRIPTION OF THE DRAWINGS

Embodiments of the present invention will now be described, by way of example only, with reference to the following drawings, in which.

DETAILED DESCRIPTION

Figure 1:
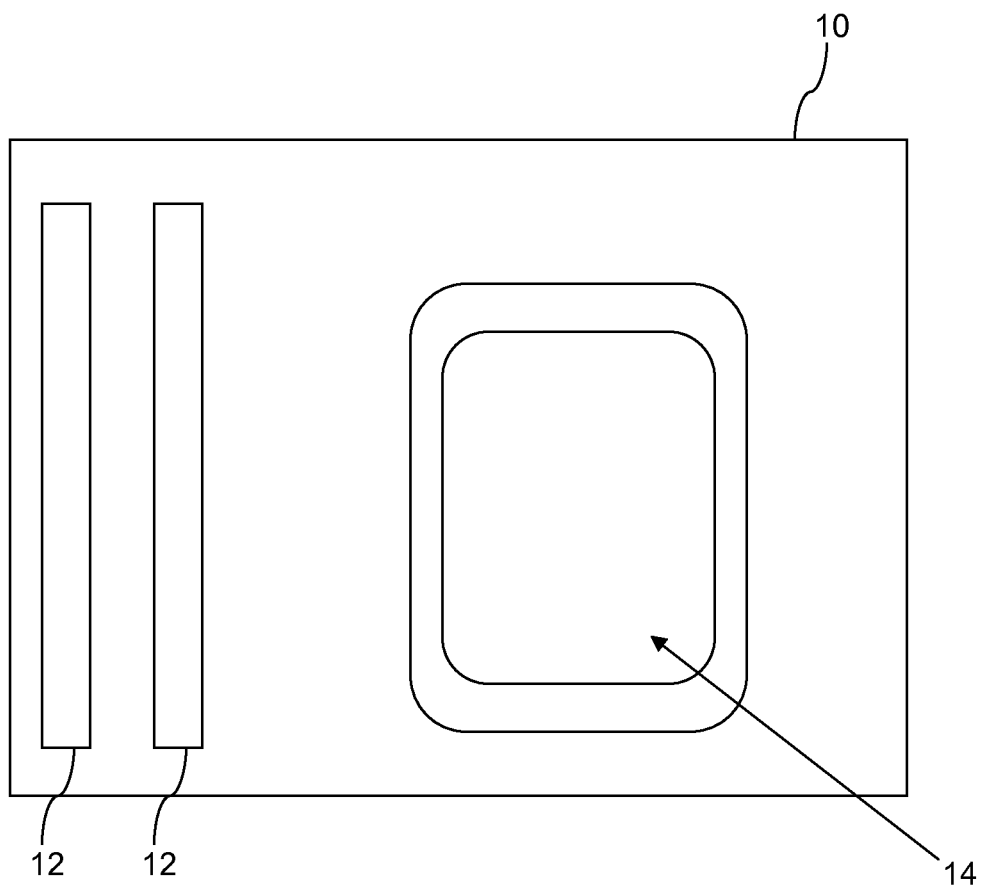
FIG. 1 is a schematic diagram of a blade enclosure.

FIG. 1 shows a blade enclosure 10 which is able to receive blades 12 and conventional computers 14. Here, the conventional computer 14 is a tablet computer. The conventional computer 14 is a portable computing device that would not normally be used with the blade enclosure 10. The conventional computer 14 has its own processing, storage, power, user interface, and display functionality. Such a computing device could be a laptop computer, a tablet computer, a handheld (palm) computer or a mobile (smart) phone, for example. The modified blade enclosure 10 is configured so that it can receive conventional computers 14 in addition to the normal blades 12 that are received.

The blade enclosure 10 is modified by the provision of physical interfaces that can connect directly to the conventional computers 14. These interfaces may be in addition to the normal interfaces provided for connection to the blades 12 or may connect in-between a conventional computer 14 and the existing interface that would be used for a blade 12. The blade enclosure 10 can be used perfectly normally without any conventional computers 14 being present in the blade enclosure 10. In this case, the blades 12 can be added and removed from the blade enclosure 10 in a purely conventional manner. The blades 12 can be used in any slot within the blade enclosure 10.

The configuration of the blade enclosure 10 allows redundant conventional computers 14 to be utilized. These conventional computers 14 may be in storage, for example with the intention of provision to new employees or as potential replacements if any existing machines in use should malfunction. The modification to the blade enclosure 10 will allow these redundant conventional computers 14 to be used by being connected to the blade enclosure 10 instead of conventional blades 12. The processing and/or storage capabilities of the conventional computers 14 can be harnessed within the blade enclosure 10. Since many modern computers do not have moving parts that can wear out, this is a sensible deployment of these processing resources.

Figure 2:
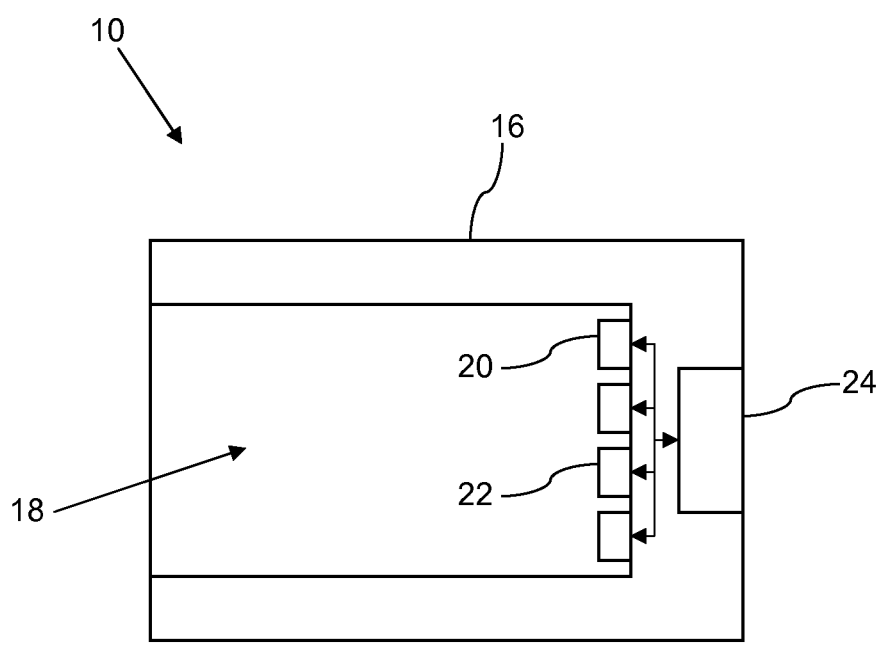
FIG. 2 is a top plan view of the blade enclosure.

More detail of the blade enclosure 10 is shown in FIG. 2. The blade enclosure 10 comprises a body 16 that defines a cavity 18. The cavity 18 is to receive the blades 12 and the conventional computers 14. The blade enclosure 10 is provided with a plurality of physical interfaces 20 of a first type, each for connecting a blade 12 to the blade enclosure 10 and a plurality of physical interfaces 22 of a second type, each for connecting a conventional computer 14 to the blade enclosure 10. These physical interfaces 20 and 22 are provided to receive the blades 12 and conventional computers 14 when they are connected into the blade enclosure 10 by an administrator.

The blade enclosure 10 further comprises a management component 24 connected to the physical interfaces 20 and 24 and for managing the blades 12 and conventional computers 14 connected to the respective physical interfaces 20 and 24. The body 16 contains the physical interfaces 20 and 22 and the management component 24. The management component 24 communicates with the blades 12 and conventional computers 14 that are connected into the blade enclosure 10 and provides a number of different functions with respect to the components that are connected into the blade enclosure 10. The management component 24 provides services such as power, cooling, networking and management to the blades 10 and conventional computers 14.

The blade enclosure 10 of FIG. 2 is shown as having only four physical interfaces 20 and 22, for ease of understanding, but in reality an enclosure such as that shown in FIGS. 1 and 2 will have twelve or more slots available to receive blades and conventional computers 14. Although FIG. 2 shows the provision of the physical interfaces 20 and 22 in a single line, they may be so arranged that each slot within the blade enclosure 10 contains both types of physical interface 20 and 22, which will allow every slot in the blade enclosure 10 to receive either a blade 10 or a conventional computer 14.

Figure 3:
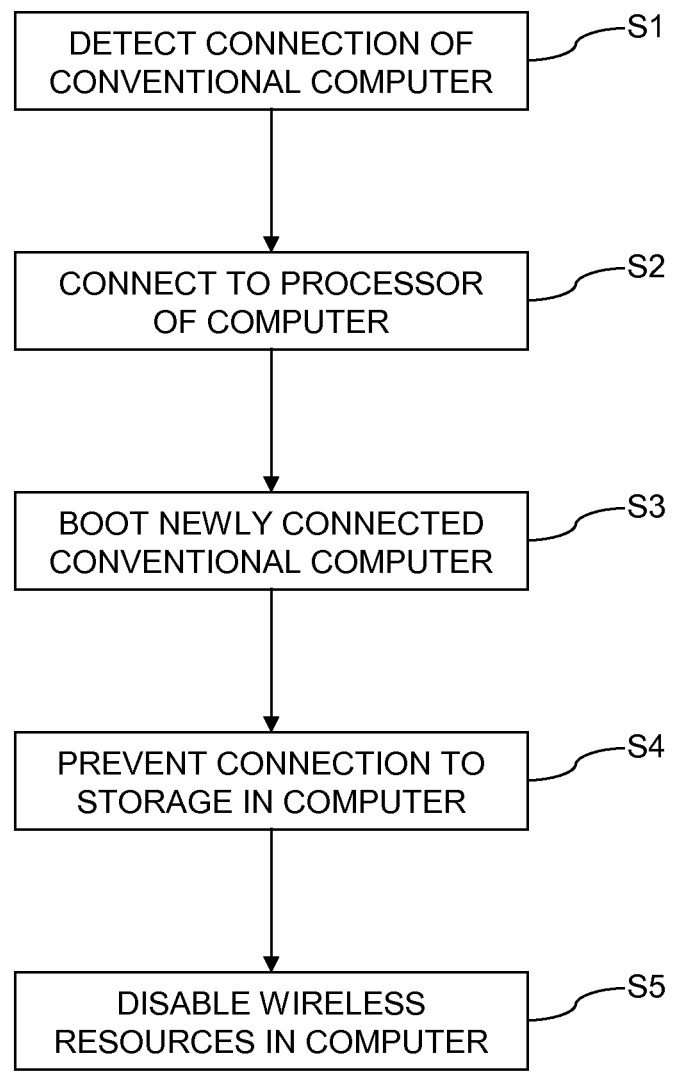
FIG. 3 is a flowchart of a method of operating the blade enclosure.

A method of operating the blade enclosure 10 is shown in FIG. 3. The management component 24 of the blade enclosure 10 is arranged to detect connection of a conventional computer 14 to a physical interface 22 of the blade enclosure 10 (step S1), to connect to a processor of the connected conventional computer 14 (step S2), to boot the connected conventional computer 14 following detection of the connection (step S3), to prevent connection to a storage device of the connected conventional computer 14 (step S4) and to disable the wireless functionality of the connected conventional computer (step S5). In this way, the management component 24 is able to configure a connection to the newly connected conventional computer 14.

Only the first two steps of this method are essential in order to configure a connection to the conventional computer 14 that has been connected to the blade enclosure 10. Step S3, which comprises booting the newly connected conventional computer 14 from the management component 24 of the blade enclosure, could be replaced by some other booting method. For example, the administrator that is intending to connect a conventional computer 14 to the blade enclosure could turn on and boot the conventional computer 14 prior to the insertion of the conventional computer 14 into the blade enclosure 10. Alternatively, the conventional computer 14 could have software running thereon that is able to detect the connection and boot the conventional computer 14 automatically.

Steps S4 and S5, which comprise respectively preventing any direct connection to the storage device of the conventional computer 14 that has been connected and disabling the wireless functionality of the conventional computer 14, are also not essential, but are preferable process steps that help to ensure the integrity of the added conventional computer 14, on the understanding that this device will be removed at some future point and used for a different purpose. It is advantageous to prevent any contamination of the storage device(s) present on the conventional computer 14 that has been connected into the blade enclosure 10. Similarly the wireless functions should be disabled in order to prevent any unauthorised access and to prevent any accidental wireless transmissions from the conventional computer 14.

Figure 4:
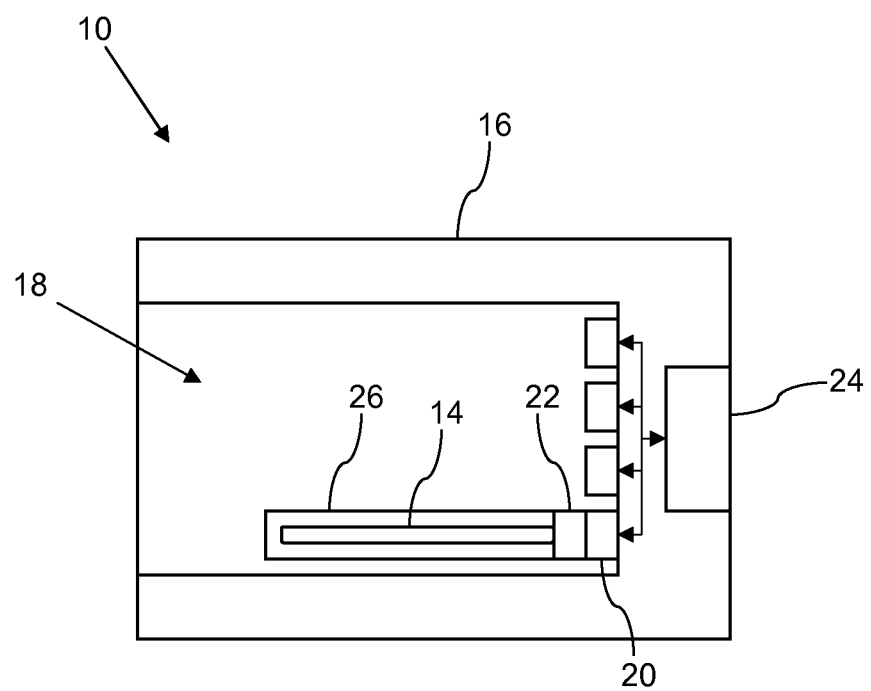
FIG. 4 is a schematic diagram of a second embodiment of the blade enclosure.

A second embodiment of the blade enclosure 10 is shown in FIG. 4. This blade enclosure 10 further comprises a caddy 26 for receiving a conventional computer 14, shown here as a tablet computer 14. The caddy 26 is connected to a physical interface 20 of the first type and comprises a physical interface 22 of the second type. This physical interface 22 mates with a suitable interface on the conventional computer 14. In this way, the caddy 26 provides a simple way of connecting a conventional computer 14 into the blade enclosure 10. The caddy 26 can itself be removed from the blade enclosure 10 in order to get direct access to the interface 20.

The blade enclosure 10 can include multiple caddies 26 that can each be used to mount a conventional computer 14 that is connected into the blade enclosure 10. Each caddy 26 provides an external shell that receives the conventional computer 14 being added to the blade enclosure 10 and will connect directly to an existing interface 20 within the blade enclosure 10. This provides a way for an administrator to connect in any unused computing resources, such as the tablet 14, without their having to be any modifications to the existing interfaces 20 found within the blade enclosure 10. The interface 22 within the caddy 26 can be specific to the hardware 14 being added or can be a suitably standardised interface.

By using existing I/O connections on tablets and laptops 14, such as those provided for a docking station, the blade enclosure 10 would ideally communicate with the new device 14 when it is plugged in and make its CPU and memory available as part of a computer cluster. The cluster nodes, of which the device 14 would be one, would be managed from the blade centre management component 24. Firmware on the device 14 would run in a cluster node mode when in the blade enclosure 10 and as an independent standard device 14 when removed from the blade enclosure 10. By operating the additional computers 14 as cluster nodes they can be added and removed from the blade enclosure with the minimum amount of reconfiguration.

The invention claimed is:

1. A blade enclosure comprising:
  a plurality of physical interfaces of a first type, each for connecting a respective blade to the blade enclosure;
  a plurality of physical interfaces of a second type, each for coupling to a respective corresponding physical I/O connector of a respective conventional computer to connect the respective conventional computer to the blade enclosure, the conventional computer comprising a portable computing device that is self-contained and provides processing, storage, power, user interface, and display functionality;
  a management component connected to the physical interfaces and for managing blades and conventional computers connected to the physical interfaces to provide computing resources to one or more external devices, wherein the management component:
    (a) detects each conventional computer connected to a respective physical interface of the second type, and
    (b) responsive thereto, configures the respective conventional computer to make a processor and memory of the respective conventional computer function as a blade in providing computing resources to the one or more external devices;
  and a body containing the physical interfaces and the management component.

2. An enclosure according to claim 1, and further comprising a caddy for receiving a conventional computer, the caddy connected to a physical interface of the first type and comprising a physical interface of the second type.

3. An enclosure according to claim 1, wherein the management component is arranged to boot the connected conventional computer responsive to detection of the conventional computer connected to a physical interface of the second type.

4. An enclosure according to claim 1, wherein the management component is arranged to prevent connection to a storage device of the connected conventional computer.

5. An enclosure according to claim 1, wherein the management component is arranged to disable the wireless functionality of the connected conventional computer.

6. An enclosure according to claim 1,
  wherein said management component manages the blades and conventional computers as a computer cluster having a plurality of nodes to provide the computing resources to the one or more external devices, and
  wherein said management component, responsive to detecting each conventional computer connected to a respective physical interface of the second type, configures the respective conventional computer to make a processor and memory of the respective conventional computer function as at least one node of said computer cluster.

7. A method of operating a blade enclosure comprising a plurality of physical interfaces of a first type, a plurality of physical interfaces of a second type, the method comprising the steps of:
  connecting a management component to the physical interfaces of the first type and the physical interfaces of the second type, the management component for managing blades and conventional computers connected to the physical interfaces to provide computing resources to one or more external devices;
  connecting, via each of one or more physical interface of the plurality of physical interfaces of the first type, a respective blade to the blade enclosure;
  coupling, each of one or more physical interface of the plurality of physical interfaces of the second type to a respective corresponding physical I/O connector of a respective conventional computer to connect the respective conventional computer to the blade enclosure, wherein each conventional computer comprising a portable computer device that is self-contained and provides processing, storage, power, user interface, and display functionality;
  detecting, with the management component, the coupling of a physical I/O connector of a first conventional computer to a physical interface of the second type; and
  responsive to detecting, with the management component, the coupling of a physical I/O connector of the first conventional computer to the physical interface of the second type, connecting the management component to a processor of the first conventional computer to configure the first conventional computer to make the processor and memory of the first conventional computer function as a blade in providing computing resources to the one or more external devices.

8. A method according to claim 7, wherein the blade enclosure further comprises a caddy for receiving a conventional computer, the caddy connected to a physical interface of the first type and comprising a physical interface of the second type.

9. A method according to claim 7, and further comprising, following detecting coupling of a physical I/O connector of a first conventional computer to a physical interface of the second type, booting the first conventional computer following detection of the coupling.

10. A method according to claim 7, and further comprising, following detecting coupling of a physical I/O connector of a first conventional computer to a physical interface of the second type, preventing connection to a storage device of the first conventional computer.

11. A method according to claim 7, and further comprising, following detecting coupling of a physical I/O connector of a first conventional computer to a physical interface of the second type, disabling the wireless functionality of the first conventional computer.

12. A method according to claim 7,
wherein said management component manages the blades and conventional computers as a computer cluster having a plurality of nodes to provide the computing resources to the one or more external devices, and
wherein said management component, responsive to detecting the coupling of a physical I/O connector of the first conventional computer to a physical interface of the second type, configures the first conventional computer to make a processor and memory of the first conventional computer function as at least one node of said computer cluster.

* * * * *